(12) United States Patent
Kayashima (10) Patent No.: US 6,414,336 B2
(45) Date of Patent: Jul. 2, 2002

(54) SEMICONDUCTOR DEVICE CAPABLE OF IMPROVING MANUFACTURING

(75) Inventor: Yuji Kayashima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/902,259

(22) Filed: Jul. 11, 2001

Related U.S. Application Data (62) Division of application No. 09/619,762, filed on Jul. 19, 2000, now Pat. No. 6,309,898.

(30) Foreign Application Priority Data

Jul. 26, 1999 (JP) .............................. 11-211009

(51) Int. Cl.[7] .............................................. H01L 23/48
(52) U.S. Cl. ........................... 257/48; 438/14; 257/765; 257/771
(58) Field of Search .............................. 438/14; 257/48, 257/771, 758, 765

(56) References Cited

U.S. PATENT DOCUMENTS 4,952,272 A * 8/1990 Okino et al. ................. 156/630
5,924,029 A 7/1999 Ference
5,976,418 A 11/1999 Fuller
6,110,823 A 8/2000 Eldridge
6,143,668 A 11/2000 Dass

FOREIGN PATENT DOCUMENTS

| JP | 1-194433 | 8/1989 |
|----|----------|--------|
| JP | 1-201964 | 8/1989 |
| JP | 2-82553 | 3/1990 |
| JP | 3-196655 | 8/1991 |
| JP | 3-268441 | 11/1991 |
| JP | 4-215451 | 8/1992 |
| JP | 04-333255 | 11/1992 |
| JP | 06-120456 | 4/1994 |
| JP | 10-107153 | 4/1998 |

* cited by examiner

Primary Examiner—David Nelms
Assistant Examiner—Thao P Le
(74) Attorney, Agent, or Firm—Whitham, Curtis & Christofferson, PC (57) ABSTRACT

In a method for manufacturing a semiconductor device, probe pads are formed simultaneously with formation of an intermediate conductive layer, and a test operation is performed upon the semiconductor device by placing probes on the probe pads. Then, post-stage processes are performed upon the semiconductor device in accordance with characteristics of the semiconductor device obtained by the test operation.

6 Claims, 9 Drawing Sheets

SEMICONDUCTOR DEVICE CAPABLE OF IMPROVING MANUFACTURING

CROSS REFERENCE TO RELATED APPLICATION

The present application is a divisional application of U.S. application Ser. No. 09/619,762, filed on Jul. 19, 2000, and now issued as U.S. Pat. No. 6,309,898.

BACKGROUND OF THE INVENTION

1. Field of the Invention

The present invention relates to a method for manufacturing a semiconductor device which is suitable for manufacturing a large number of kinds of products.

2. Description of the Related Art

In a prior art method for manufacturing a semiconductor device such as a MOS device (see JP-A-3-196655 & JP-A-3-268441), probe pads are formed simultaneously with formation of a lower aluminum wiring layer to complete a monitoring MOS element. Then, a test operation is performed by placing probes onto the probe pads upon the monitoring MOS element. This will be explained later in detail.

In the above-described prior art method, however, even when the test operation indicates that the monitoring MOS element has failed to save the post-stage processes of the device, the manufacturing yield is low.

In order to improve the manufacturing yield, it has been suggested that the probe pads be formed simultaneously with the formation of the gate electrode layer (see JP-A-1-194433, JP-A-1-201964 & JP-A-4-215451). Even in this case, after the test operation indicates that the monitoring MOS element has failed, the post-stage processes of the device are saved, which may increase the manufacturing yield. However, if such devices are scrapped, the manufacturing yield is still low.

SUMMARY OF THE INVENTION

It is an object of the present invention to provide a method for manufacturing a semiconductor device capable of increasing the manufacturing yield.

According to the present invention, in a method for manufacturing a semiconductor device, probe pads are formed simultaneously with formation of an intermediate conductive layer, and a test operation is performed upon the semiconductor device by placing probes on the probe pads. Then, post-stage processes are performed upon the semiconductor device in accordance with characteristics of the semiconductor device obtained by the test operation.

Since the post-stage processes such as aluminum wiring processes are changed in accordance with the characteristics of the tested semiconductor device, a large number of kinds of products can be manufactured, which increases the manufacturing yield.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art method for manufacturing a semiconductor device will be explained with reference to FIGS. 1A, 1B, 1C, 1D, 1E and 2 (see JP-A-3-196655 & JP-A-3-268441).

Figure 1A:
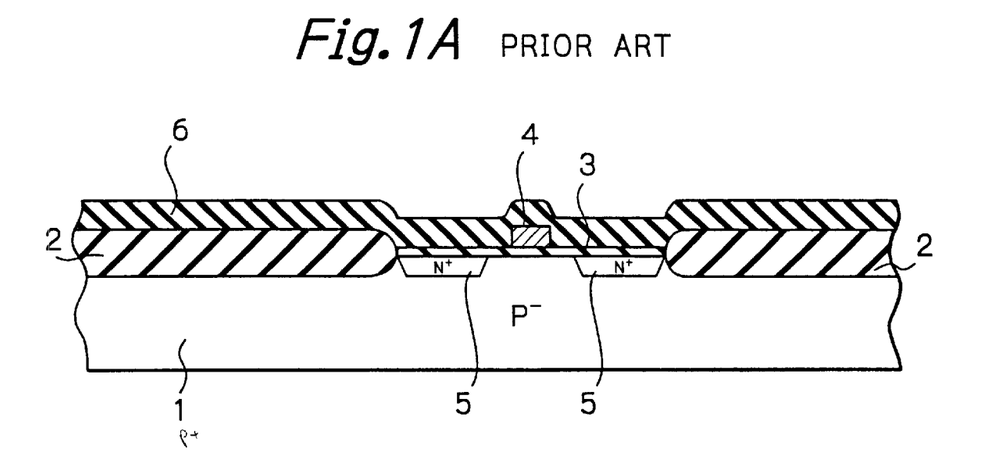
FIGS. 1A, 1B, 1C, 1D and 1E are cross-sectional views for explaining a prior art method for manufacturing a semiconductor device.

First, referring to FIG. 1A, a field silicon oxide layer 2 is grown by thermally oxidizing a $P^-$-type monocrystalline silicon substrate 1 using a local oxidation of silicon (LOCOS) process. Then, the silicon substrate 1 is thermally oxidized to form a gate silicon oxide layer 3. Then, a polycrystalline silicon layer is deposited by a chemical vapor deposition (CVD) process, and then, the polycrystalline silicon layer is patterned by a photolithography and etching process to form a gate electrode layer 4. Then, N-type impurity ions such as arsenic ions are implanted into the silicon substrate 1 in self-alignment with the gate electrode layer 4 to form $N^+$-type impurity diffusion regions 5. Then, a high temperature silicon oxide (HTO) layer 6, which has good step coverage characteristics, is deposited on the entire surface by a high temperature CVD process.

Figure 1B:
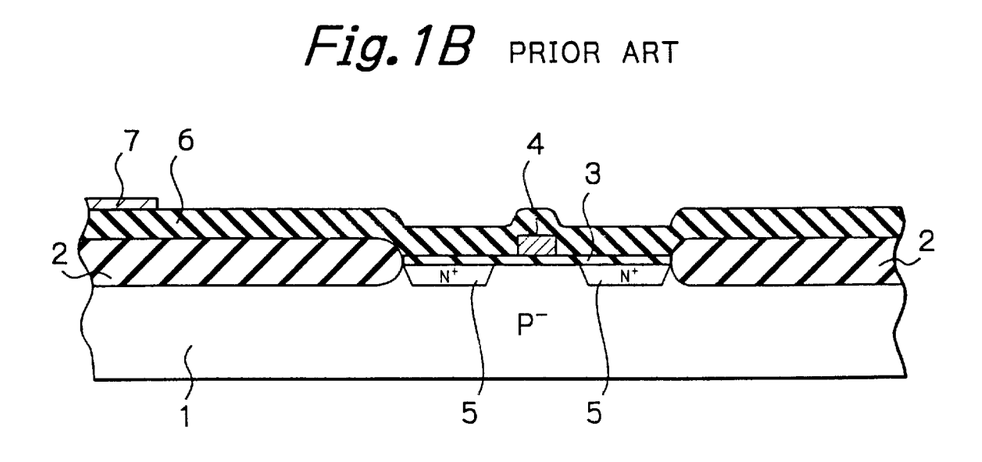

Next, referring to FIG. 1B, a tungsten silicide (WSi) layer is deposited on the entire surface by a sputtering process or the like, and the WSi layer is patterned by a photolithography and etching process to form a WSi layer 7. Note that the WSi layer 7 serves as a ground layer or a power supply layer which is connected via contact holes (not shown) in the HTO layer 6 to the silicon substrate 1.

Figure 1C:
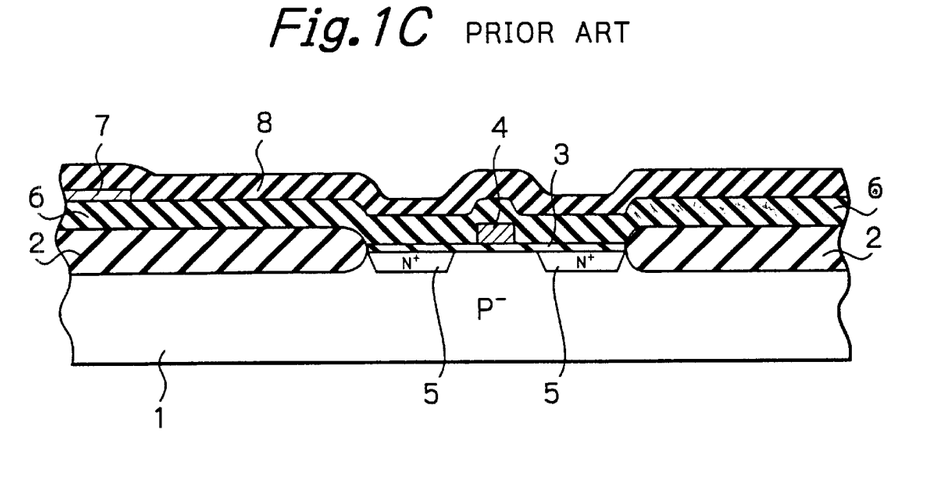

Next, referring to FIG. 1C, a boron-including phosphorus silicated glass (BPSG) layer 8 is deposited on the entire surface by a CVD process.

Figure 1D:
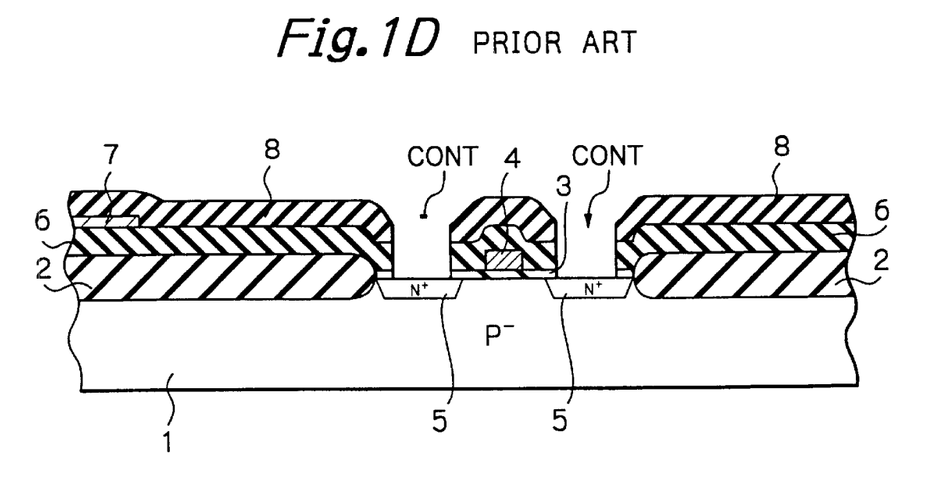

Next, referring to FIG. 1D, contact holes CONT are perforated in the BPSG layer 8, the HTO layer 6 and the gate silicon oxide layer 3 by a photolithography and etching process.

Figure 1E:
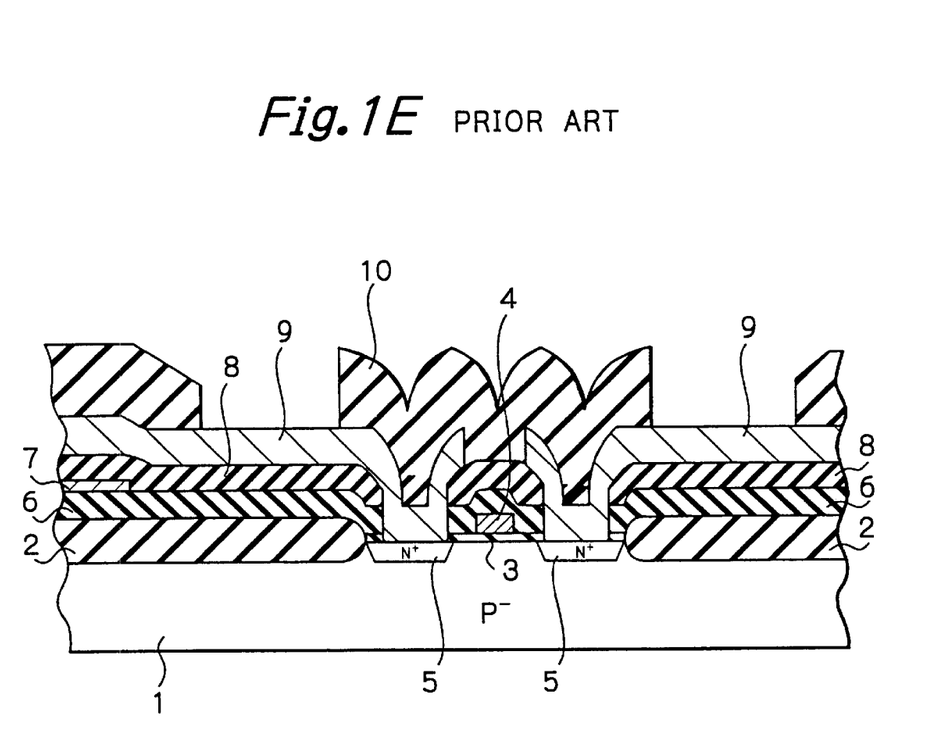

Finally, referring to FIG. 1E, an aluminum layer is deposited on the entire surface by a sputtering process, and the aluminum layer is patterned to form probe pads 9. Then, a silicon oxide nitride (SiON) layer is deposited on the entire surface by a CVD process, and the SiON layer is patterned by a photolithography and etching process to expose the probe pads 9.

Figure 2:
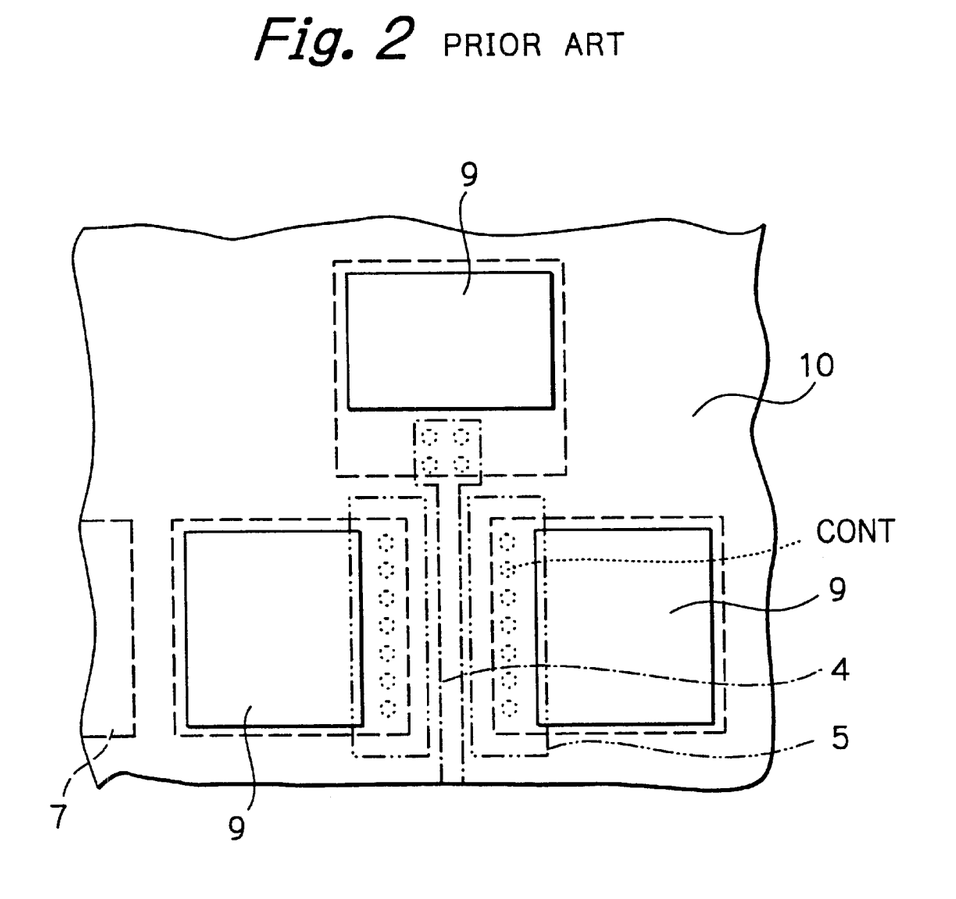
FIG. 2 is a plan view of the device of FIG. 1E.

FIG. 2 is a plan view of the device of FIG. 1E.

Thus, a monitoring MOS element is completed.

A test operation can be performed by placing probes onto the probe pads 9 upon the monitoring MOS element.

In the above-described prior art method, however, since the probe pads 9 are formed simultaneously with the formation of the aluminum layer which serves as a lower wiring layer, even when the test operation indicates that the monitoring MOS element has failed to save the post-stage processes of the device, the manufacturing yield is low.

In order to improve manufacturing yield, it has been suggested that the probe pads 9 be formed simultaneously with the formation of the gate electrode layer 4 (see JP-A-1-194433, JP-A-1-201964 and JP-A-4-215451). Even in this case, after the test operation indicates that the monitoring MOS element has failed, the post-stage processes of the device are saved, which may increase the manufacturing yield. However, if such devices are scrapped, the manufacturing yield is still low.

A first embodiment of the method for manufacturing a semiconductor device according to the present invention will now be explained with reference to FIGS. 3A, 3B, 3C, 4 and 5.

Figure 3A:
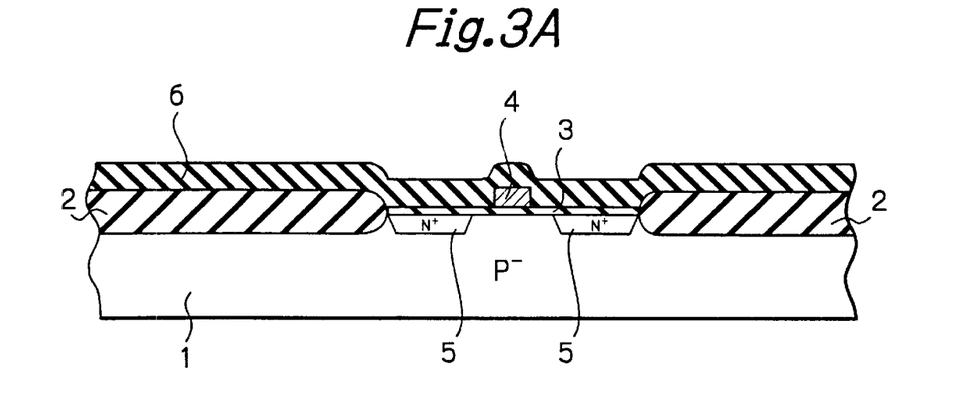
FIGS. 3A, 3B and 3C are cross-sectional views for explaining a first embodiment of the method for manufacturing a semiconductor device according to the present invention.

First, referring to FIG. 3A, in the same way as in FIG. 1A, a field silicon oxide layer 2 is grown by thermally oxidizing a P$^-$—type monocrystalline silicon substrate 1 using a LOCOS process. Then, the silicon substrate 1 is thermally oxidized to form a gate silicon oxide layer 3. Then, a polycrystalline silicon layer is deposited by a CVD process, and then, the polycrystalline silicon layer is patterned by a photolithography and etching process to form a gate electrode layer 4. Then, N-type impurities ions such as arsenic ions are implanted into the silicon substrate 1 in self-alignment with the gate electrode layer 4 to form N$^+$-type impurity diffusion regions 5. Then, an HTO layer 6, which has good step coverage characteristics, is deposited on the entire surface by a high temperature CVD process.

Figure 3B:
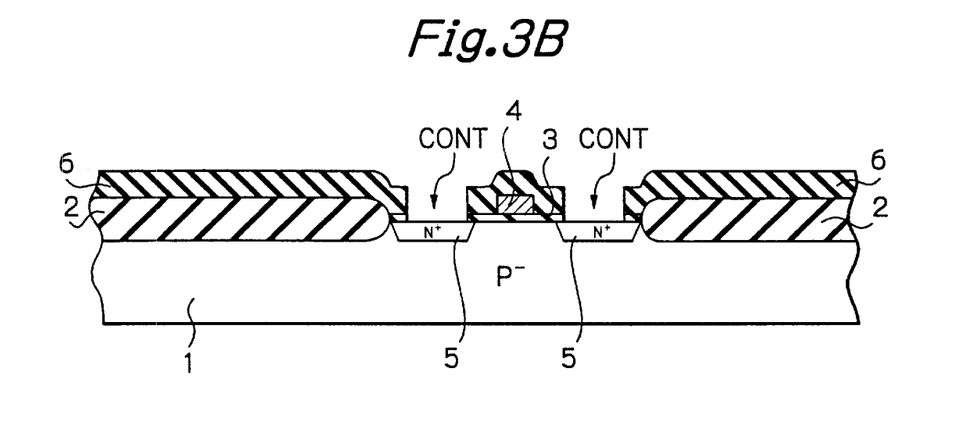

Next, referring to FIG. 3B, contact holes CONT are perforated in the HTO layer 6 and the gate silicon oxide layer 3 by a photolithography and etching process.

Figure 3C:
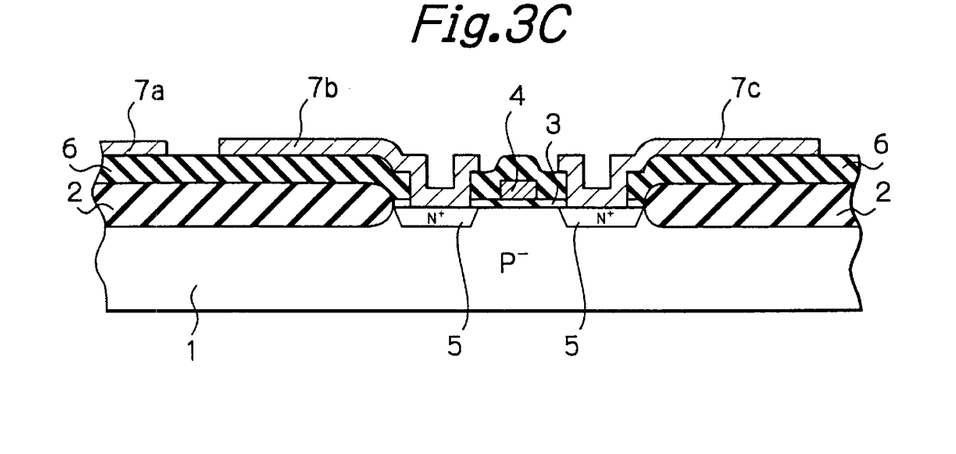

Finally, referring to FIG. 3C, a WSi layer is deposited on the entire surface by a sputtering process or the like, and the WSi layer is patterned by a photolithography and etching process to form WSi layers 7a, 7b, 7c and 7d. Note that the WSi layer 7d is not shown in FIG. 3C, but in FIG. 4. The WSi layer 7a serves as a ground layer or a power supply layer which is connected via contact holes (not shown) in the HTO layer 6 to the silicon substrate 1. On the other hand, the WSi layers 7b, 7c and 7d serve as probe pads.

Figure 4:
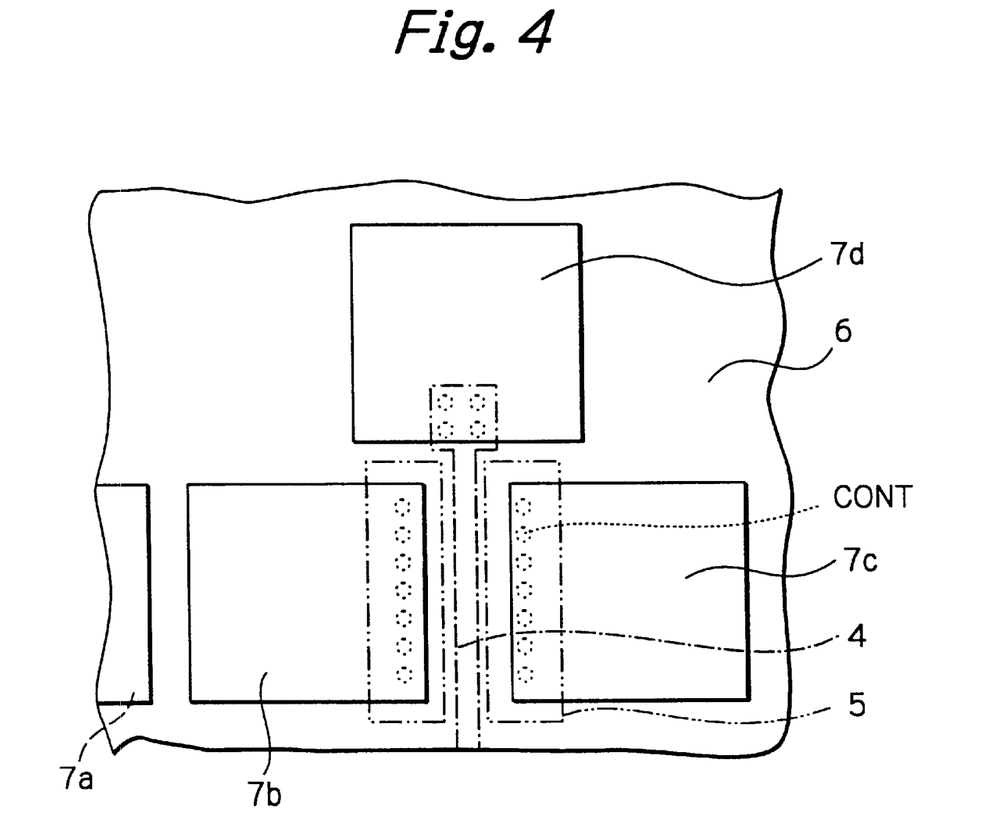
FIG. 4 is a plan view of the device of FIG. 3C.

FIG. 4 is a plan view of the device of FIG. 3C.

Thus, a monitoring MOS element is completed.

A test operation can be performed by placing probes onto the WSi layers (probe pads) 7b, 7c and 7d upon the monitoring MOS element.

Figure 5:
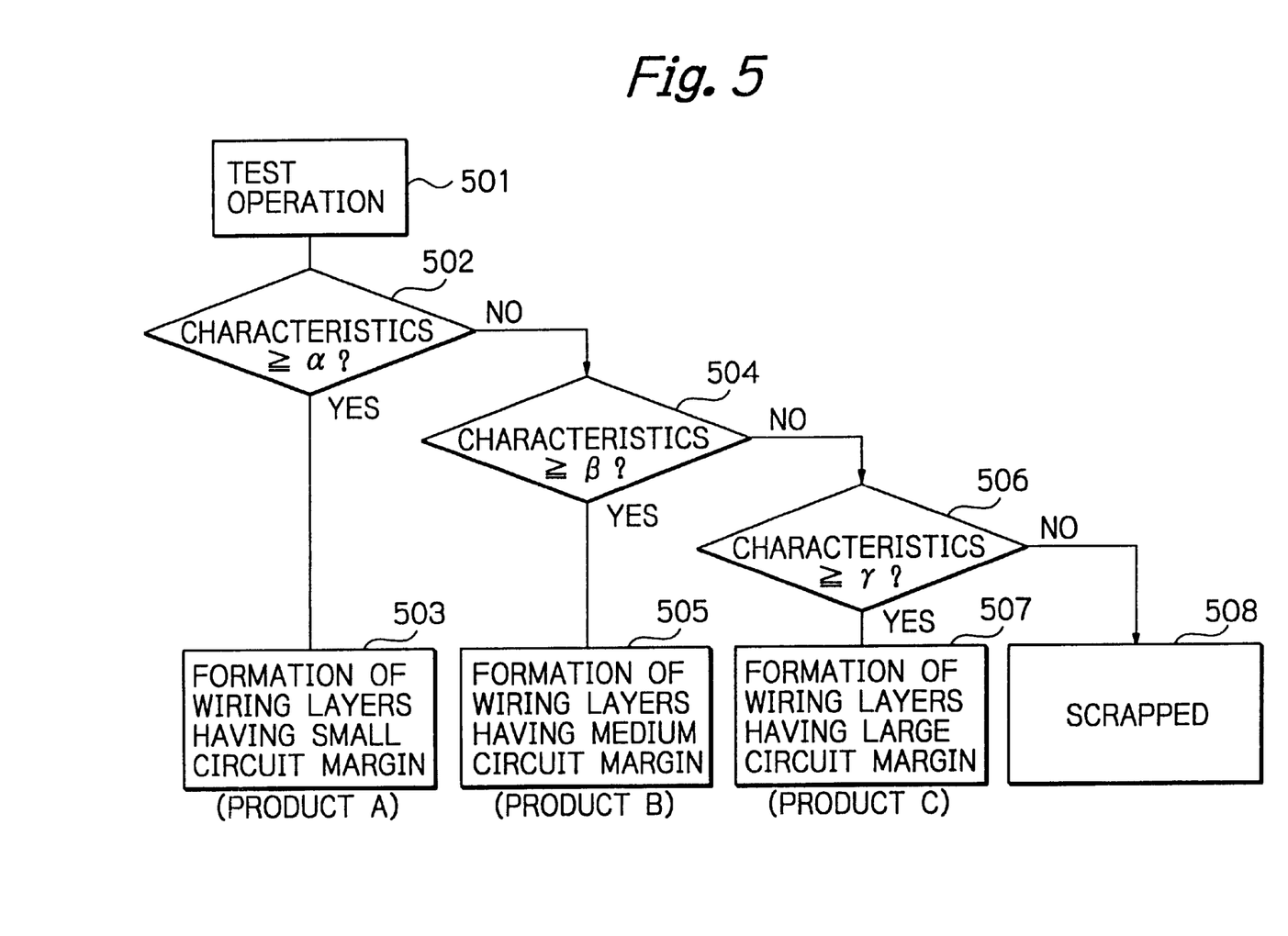
FIG. 5 is a flowchart for explaining the post-stage processes of the device (wafer or lot) manufactured by the method of FIGS. 3A, 3B and 3C.

As illustrated in FIG. 5, after the above-mentioned test operation is carried out, the control proceeds to step 502 which determines whether the characteristics of the monitoring MOS element are higher than a first level $\alpha$. Only if the characteristics of the monitoring MOS element are higher than the first level $\alpha$, does the control proceed to step 503 in which lower and upper wiring layers made of aluminum having a relatively small circuit margin are formed at post stages to produce a product A. At step 502, if the characteristics of the MOS element is not higher than the first level $\alpha$, the control proceeds to step 504.

At step 504, it is determined whether the characteristics of the monitoring MOS element are higher than a second level $\beta(<\alpha)$. Only if the characteristics of the monitoring MOS element are higher than the second level $\beta$, does the control proceed to step 505 in which lower and upper wiring layers made of aluminum having a relatively medium circuit margin are formed at post stages to produce a product B. At step 504, if the characteristics of the MOS element are not higher than the second level $\beta$, the control proceeds to step 506.

At step 506, it is determined whether the characteristics of the monitoring MOS element are higher than a third level $\gamma(<\beta)$. Only if the characteristics of the monitoring MOS element are higher than the third level $\gamma$, does the control proceed to step 507 in which lower and upper wiring layers made of aluminum having a relatively large circuit margin are formed at post stages to produce a product C. At step 506, if the characteristics of the MOS element are not higher than the third level $\gamma$, the control proceeds to step 508, which scraps the wafer (or lot) including the monitoring MOS element.

Thus, various kinds of products can be produced in accordance with the characteristics of the monitoring MOS element, which increases the manufacturing yield.

Figure 6:
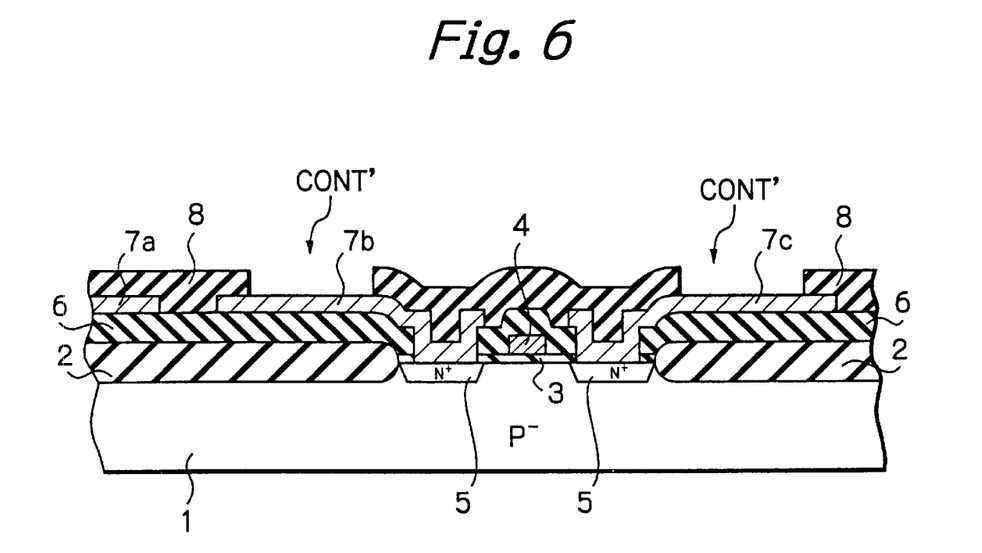
FIG. 6 is a cross-sectional view for explaining a second embodiment of the method for manufacturing a semiconductor device according to the present invention.

In FIG. 6, which illustrates a second embodiment of the present invention, before the test operation, a BPSG layer 8 is deposited on the entire surface by a CVD process, and then contact holes CONT' are perforated in the BPSG layer 8 by a photolithography and etching process.

Figure 7:
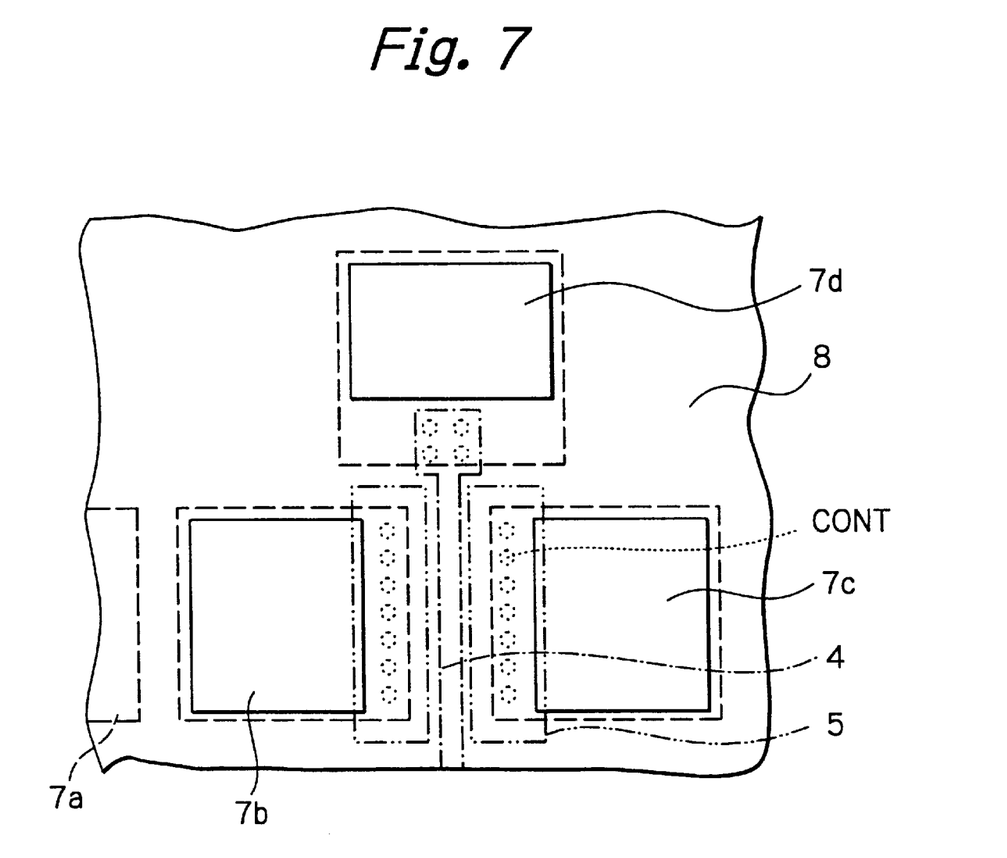
FIG. 7 is a plan view of the device of FIG. 6.

FIG. 7 is a plan view of the device of FIG. 6.

A test operation can be performed by placing probes onto the WSi layers (probe pads) 7b, 7c and 7d through the contact holes CONT' upon the monitoring MOS element.

In the second embodiment, the characteristics of the monitoring MOS element can be determined in consideration of the affect of heat generated in a CVD process for depositing the BPSG layer 8, which could accurately determine the characteristics of the monitoring MOS transistor.

Also, in the second embodiment, the same aluminum wiring forming processes in the first embodiment as illustrated in FIG. 5 are carried out.

In the above-described embodiments, the layers 7a, 7b, 7c and 7d can be made of polycrystalline silicon by a CVD process instead of WSi.

As explained hereinabove, according to the present invention, since various kinds of products can be produced in accordance with the characteristics of the monitoring MOS element, the manufacturing yield can be increased.

What is claimed is:

1. A semiconductor device, including a monitoring semiconductor structure with a plurality of other semiconductor structures on a semiconductor substrate, comprising:

an intermediate conductive layer on said semiconductor substrate;

probe pads made of the same materials as said intermediate conductive layer and formed simultaneously with said intermediate layer on said semiconductor structure; and aluminum wiring layers made depending upon characteristics of said monitoring structure of said semiconductor device obtained by a test operation upon said probe pads, wherein one of a plurality of different types of semiconductor devices is made depending on measured characteristics of the monitoring semiconductor structure.

2. The device as set forth in claim 1, wherein said intermediate conductive layer comprises at least one of a ground layer and a power supply layer.

3. The device as set forth in claim 1, wherein said probe pads and said intermediate layer are made of tungsten silicide.

4. The device as set forth in claim 1, wherein said probe pads and said intermediate conductive layer are made of polycrystalline silicon.

5. The device as set forth in claim 1, wherein circuit margins of said aluminum wiring layers are changed in accordance with the characteristics of said semiconductor device.

6. The device as set forth in claim 5, wherein the circuit margins of said aluminum layers are smaller when the characteristics of said semiconductor device are better.

* * * * *